(12) United States Patent
Tong et al.

(10) Patent No.: US 6,387,572 B1
(45) Date of Patent: May 14, 2002

(54) LOW CTE SUBSTRATE FOR REFLECTIVE EUV LITHOGRAPHY

(75) Inventors: Tom X. Tong, Milpitas; Kramadhati V. Ravi, Atherton, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/395,310

(22) Filed: Sep. 13, 1999

(51) Int. Cl.⁷ .............................. G03F 9/00; G21K 5/00
(52) U.S. Cl. ............................................ 430/5; 378/35
(58) Field of Search ..................... 430/5, 322; 378/35; 428/336, 426, 428

(56) References Cited

U.S. PATENT DOCUMENTS

| | | | |
|---|---|---|---|
| 5,272,744 A | | 12/1993 | Itou et al. |
| 5,978,441 A | * | 11/1999 | Early .................... 378/34 |
| 6,048,652 A | * | 4/2000 | Nguyen et al. .......... 430/5 |
| 6,159,643 A | * | 12/2000 | Levinson et al. ........ 430/5 |
| 6,159,824 A | * | 12/2000 | Henley et al. .......... 438/455 |

* cited by examiner

*Primary Examiner*—S. Rosasco
(74) *Attorney, Agent, or Firm*—Mark V. Seeley

(57) ABSTRACT

A substrate for reflective EUV lithography that includes a first layer that has a low coefficient of thermal expansion and a second layer, formed on the first layer, that has a high surface quality. The second layer may have a coefficient of thermal expansion that is higher than the coefficient of thermal expansion of the first layer.

14 Claims, 2 Drawing Sheets

LOW CTE SUBSTRATE FOR REFLECTIVE EUV LITHOGRAPHY

FIELD OF THE INVENTION

The present invention relates to substrates for making masks and mirrors used in photolithography for making semiconductors. In particular, the present invention relates to substrates that have a very low coefficient of thermal expansion ("CTE"), which may be used in reflective extreme ultraviolet ("EUV") lithography.

BACKGROUND OF THE INVENTION

Polished silicon wafers are currently used to make reflective masks and mirrors (a.k.a. reflective lenses) for EUV photolithography. Using silicon ensures that the mask or mirror will have the desired surface quality. Because silicon has a relatively high CTE, however, masks and mirrors made from it may deform, when subjected to heat generated during EUV illumination. This effect may be magnified when the substrate is exposed to higher operating temperatures. For that reason, silicon may not be suitable for making masks and mirrors that will define features which are less than 0.10 micron wide. At those dimensions, even slight warpage of the substrate, which can result from expansion upon heating, can unacceptably distort the image that the mask is suppose to generate.

Certain low CTE materials may be used instead of silicon to form masks and mirrors. It may not be possible, however, to adequately polish the surface of such low CTE materials to generate the high surface quality that EUV lithography requires. The polishing process may scratch the surface of such materials, or introduce other defects, rendering the resulting mask/mirror unsuitable for use in a reflective EUV process.

Accordingly, there is a need for a substrate that may be used to make masks and mirrors, for use in reflective EUV lithography, that has both a low CTE and a high quality surface. There is a need for such a substrate whose surface is substantially free of scratches or other defects, and which does not change dimension when heated. The present invention provides such a substrate and a process for making it.

SUMMARY OF THE INVENTION

The present invention covers a substrate that may be used to make masks and mirrors for reflective EUV lithography. That substrate has a first layer that has a low coefficient of thermal expansion. A second layer, which has a high surface quality, is formed on the first layer. The second layer may have a coefficient of thermal expansion that is higher than the coefficient of thermal expansion of the first layer.

DETAILED DESCRIPTION OF THE PRESENT INVENTION

A substrate for reflective EUV lithography, and method for making it, are described. In the following description, specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
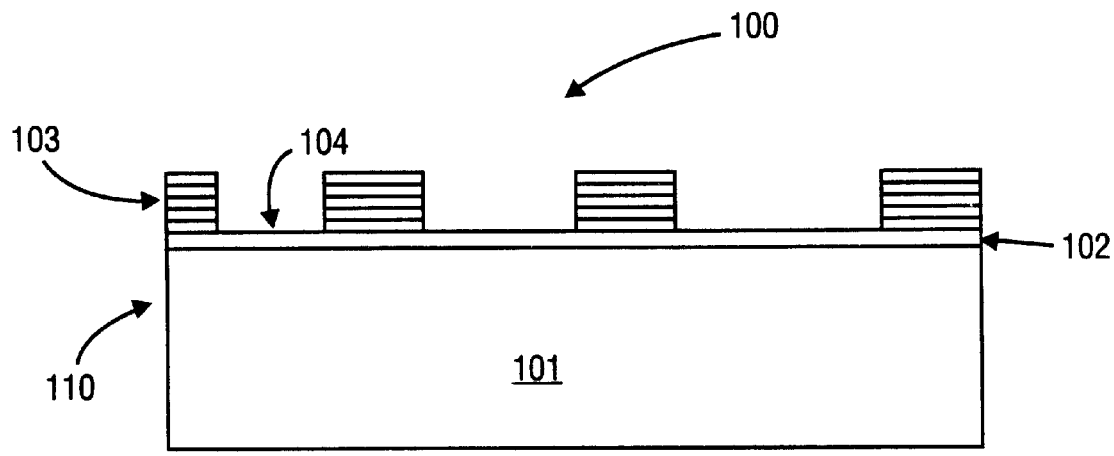
FIG. 1 is a schematic representing a cross-section of a mask that includes the substrate of the present invention.

FIG. 1 shows mask 100 that includes substrate 110 of the present invention. Substrate 110 comprises first layer 101 and second layer 102, which is formed on first layer 101. First layer 101 has a low coefficient of thermal expansion, preferably a CTE that is substantially less than 2.0 ppm/° C. at 25° C., and at other conventional temperatures employed during EUV lithography. First layer 101 may be made, at least in part, from materials having an ultra low CTE, e.g., a CTE of less than about 0.1 ppm/° C. at such temperatures. Such materials include certain titanium silicate glasses, such as the glass sold under the tradename ULE® by Corning, Inc., and certain glass ceramics, such as the glass sold under the tradename ZERODUR® by Schott Glass Technologies. Table 1 compares CTEs reported for these materials with the CTE reported for silicon at various temperatures.

TABLE 1

| Material | CTE (ppm/° C.) | Temperature (° C.) |
| --- | --- | --- |
| Silicon | 2.616 | 27 |
| Silicon | 3.25 | 127 |
| ULE | +/−0.015 | 5–35 |
| ZERODUR | +/−0.05 | 0–50 |

Second layer 102 has a high surface quality and may have a coefficient of thermal expansion that is higher than the coefficient of thermal expansion of first layer 101. The phrase "high surface quality," as used herein, is meant to describe a surface that is: (1) substantially free of defects, e.g., those larger than the smallest resolvable integrated circuit feature that will be defined by a reflective device that will include the substrate, and (2) substantially free of deviations in surface topology that exceed ½ nm of the wavelength of light to which the substrate will be exposed.

When used to make a mask or mirror for EUV lithography, the surface of second layer 102 preferably is substantially free of defects larger than 0.10 microns and of deviations in surface topology that exceed 10 nm. Layer 102 should be substantially free of defects that either cause light, having EUV wavelengths, to be absorbed when it should be reflected, or to be reflected too strongly. If layer 102 has too many defects of too large a size, or is not sufficiently flat, the resulting mask formed on top of that layer may be unsuitable for use.

Second layer 102 preferably comprises silicon, and may be formed from a silicon wafer, as described below. Although silicon is the preferred material for making second layer 102, other materials may be used instead, such as sapphire, germanium, beryllium or silicon carbide.

Layer 101 should be thick enough to provide adequate structural support for the mask. In a preferred embodiment, layer 101 is about as thick as a standard silicon wafer, e.g., between about 600 and about 700 microns thick. Layer 102 preferably is less than about 5 microns thick, and more preferably is between about 0.2 and about 5 microns thick. Layer 102, when initially formed on layer 101, must be thick enough to enable polishing without punch through. After it is polished, however, that layer should be thin enough to minimize the effect it has on the CTE of substrate 110.

Although the substrate of the present invention may be used to make a wide variety of stepper or scanner masks and mirrors for use in reflective lithography, FIG. 1 shows use of substrate 110 to make mask 100. Mask 100 includes multi-layer reflective structure 103, which is formed on substrate 110. Portions of structure 103 have been removed, e.g., via a conventional etch process—such as a plasma etch process using conventional materials and equipment, to expose sections 104 of substrate 110.

Multi-layer reflective structure 103 comprises thin sheets of alternating heavy and light element materials, which create a resonant reflecting mirror surface. The number of sheets, their thicknesses, and the types of materials used may depend upon, the particular application that employs multi-layer reflective structure 103. Between about 20 and about 100 sheets of alternating molybdenum and silicon, each having a thickness that is preferably between about 20 and about 120 angstroms, should be suitable for EUV applications that employ wavelengths between about 5 and about 25 nm, such as a wavelength of about 13 nm. Although molybdenum is preferred for making the heavy element sheets included in multi-layer reflective structure 103, other materials may be used instead, such as ruthenium, rhodium, tungsten, rhenium, nickel or chromium. Although silicon is preferred for the light element sheets, other materials that may be used include beryllium, boron or carbon.

The substrate represented by FIG. 1 thus has a low CTE, which a EUV lithography mask may require, while providing the high surface quality that such masks may also need. The relatively thin layer, which caps the underlying low CTE layer, enables the substrate to maintain high surface quality, while retaining a low CTE. Maintaining such a high surface quality may be especially important when making a mask that includes a resonant reflective structure, like multi-layer reflective structure 103, as such a structure should be formed on a very flat substrate. In this regard, although the surface topology of various portions of layer 102 should not vary by more than ½ the wavelength of the light to which that layer will be exposed, in many applications it is even more preferred that such deviation be kept below ¼ of that wavelength. Because the substrate of the present invention enables manufacture of a mask or mirror that has both a low CTE and a high surface quality, such a substrate may enable manufacture of reflective EUV mirrors and masks for use in 0.10 micron, and perhaps even more advanced, technology.

In addition to forming multi-layer reflective structure 103 on substrate 110, or as an alternative to forming that structure on that substrate, various structures that are conventionally applied to the surface of substrates used to form masks or mirrors may be formed on substrate 110. For example, instead of etching structure 103, after it is formed on substrate 110, an absorbing material may be deposited on that structure, then etched to expose part of reflective structure 103 to light. Those skilled in the art will further appreciate that certain phase shifting materials may be formed on structure 103 to generate a mask that enables phase shifting.

Figure 2A:
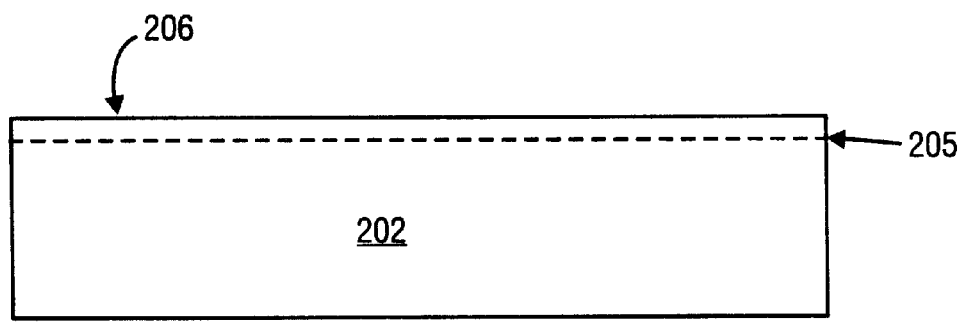
FIGS. 2a–c are schematics representing cross-sections of structures that may be made, when making the substrate represented by FIG. 1.

The substrate of the present invention may be made as follows. First, ionized hydrogen is implanted into polished silicon wafer 202, which preferably includes on its surface a thin layer of silicon dioxide—e.g., a layer that is between about 150 and 2,000 angstroms thick. (When a silicon dioxide layer is formed on the silicon substrate, it should help the silicon layer to firmly attach to the low CTE substrate after heat is applied.) The implant step produces the structure shown in FIG. 2a, in which dashes represent thin hydrogen rich plane 205 that is formed beneath surface 206 of silicon wafer 202. The depth of plane 205 depends upon the implant energy used to implant the hydrogen. Hydrogen preferably is implanted at between about $2\times10^{16}$ and $2\times10^{17}$ particles/cm$^3$ and at an energy sufficient to produce a continuous stress surface along plane 205 at a distance that is between about 1,000 and about 5,000 angstroms below surface 206.

Figure 2B:
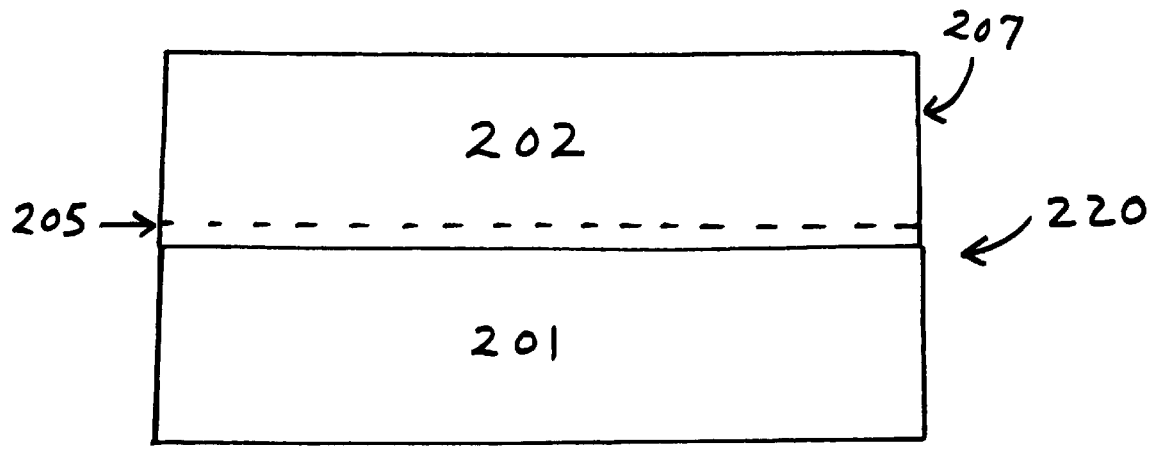
Figure 2C:
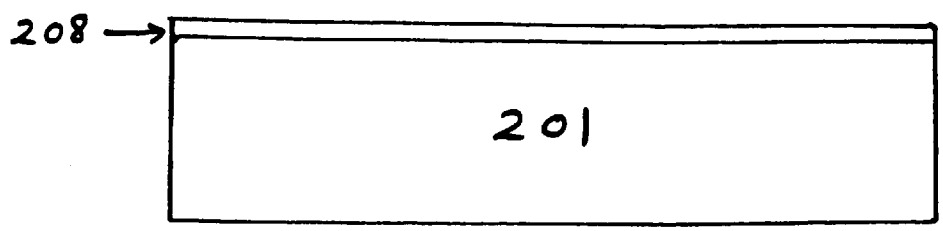

After the hydrogen implant step, silicon wafer 202 is placed face down on top of polished low CTE substrate 201, as shown in FIG. 2b. Van der Walls forces bind silicon wafer 202 to low CTE substrate 201, forming structure 220. Structure 220 is then subjected to a two stage heating process, preferably in an inert environment. Initially, structure 220 is subjected to a temperature of between about 400° C. and about 600° C. That initial heating step will cause portion 207 of silicon wafer 202 to delaminate from structure 220, e.g., be cut away from structure 220 at hydrogen implant plane 205, leaving relatively thin layer 208 on top of low CTE substrate 201, as shown in FIG. 2c. A high temperature anneal, which preferably employs a temperature between about 800° C. and about 1100° C., is then applied to cause layer 208 to bond tightly and uniformly to low CTE substrate 201.

Although a single two stage thermal process is preferred, two separate thermal steps may be applied instead—the first to break portion 207 from structure 220, and the second to tightly bond layer 208 to low CTE substrate 201. In addition, as an alternative to the process described above for forming the substrate of the present invention, a silicon wafer may be placed face down on the low CTE substrate. The resulting structure may then be heated to tightly bind the two materials together. After the heating step, the silicon wafer may be polished down to the desired thickness.

After the anneal step, which should take between about 10 and about 30 minutes to complete, layer 208 may be processed to achieve the high surface quality that EUV masks/mirrors require. When layer 208 comprises silicon, such processing may comprise polishing layer 208 using conventional materials and process steps used to polish silicon wafers. A very brief touch polishing step, using conventional chemical mechanical polishing equipment and materials, may be sufficient to ensure that the resulting silicon layer has a very smooth and flat surface. That surface should be polished until it is substantially free of deviations in surface topology that exceed ½ of the wavelength of light to which the substrate will be exposed.

An improved substrate, and method for making it, has been described. This substrate combines a relatively thick low CTE layer with a relatively thin surface layer, which has a high surface quality, to generate a substrate having both a low CTE and a high surface quality.

Features shown in the above referenced drawings are not intended to be drawn to scale, nor are they intended to be shown in precise positional relationship. Additional components that may be included in the substrate of the present invention, or additional steps that may be used to make it, have been omitted as they are not useful to describe aspects of the present invention.

Although the foregoing description has specified a substrate that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A substrate for reflective EUV lithography comprising:
   a first layer that has a low coefficient of thermal expansion, and a second layer, formed on the first layer, that has a high surface quality, that is between about 0.2 and about 5 microns thick, and that consists essentially of at least one of the materials selected from the group consisting of silicon, sapphire, germanium, beryllium, and silicon carbide.

2. The substrate of claim 1 wherein the second layer consists essentially of silicon and has a coefficient of thermal expansion that is higher than the coefficient of thermal expansion of the first layer.

3. The substrate of claim 2 wherein the second layer is:

substantially free of defects larger than the smallest resolvable integrated circuit feature that will be defined by a reflective device that will include the substrate, and substantially free of deviations in surface topology that exceed ½ of the wavelength of light to which the substrate will be exposed.

4. The substrate of claim 1 wherein the first layer has a coefficient of thermal expansion that is substantially less than 2.0 ppm/° C. at temperatures employed during EUV lithography.

5. The substrate of claim 1 wherein the first layer has a coefficient of thermal expansion that is less than about 0.1 ppm/° C. at temperatures employed during EUV lithography.

6. The substrate of claim 1 wherein the first layer comprises a low CTE glass selected from the group consisting of titanium silicate glass and ceramic glass.

7. A photolithographic mask comprising:

means for defining features that are less than about 0.10 micron wide on an integrated circuit, the means for defining such features being formed on a silicon containing layer that consists essentially of silicon, that is substantially free of defects that are larger than 0.10 micron, and that is substantially free of deviations in surface topology that exceed 10 nm, the silicon layer directly contacting a glass layer having a coefficient of thermal expansion that is substantially less than 2.0 ppm/° C. at temperatures employed during EUV lithography.

8. The photolithographic mask of claim 7 wherein the silicon layer is less than about 5 microns thick.

9. The photolithographic mask of claim 8 wherein the means for defining features on an integrated circuit that are less than about 0.10 micron wide comprises multiple layers that alternately comprise molybdenum and silicon, which are formed on the silicon layer.

10. The photolithographic mask of claim 9 wherein the means for defining features on an integrated circuit that are less than about 0.10 micron wide comprises a pattern etched through the molybdenum and silicon layers.

11. The photolithographic mask of claim 10 wherein the mask is capable of reflecting light having a wavelength of less than about 25 nm to define integrated circuit features that are less than about 0.10 micron wide.

12. A method for making a substrate for making a device used in EUV reflective lithography comprising:

forming on a first layer, which has a low coefficient of thermal expansion, a second polishable layer; then polishing the second layer until it is substantially free of deviations in surface topology that exceed 10 nm.

13. The method of claim 12 wherein the first layer comprises a low CTE glass selected from the group consisting of titanium silicate glass and ceramic glass and the second layer comprises silicon.

14. The method of claim 13 further comprising:

implanting hydrogen into a polished wafer that comprises silicon;

placing the side of the wafer that received the hydrogen implant onto the glass layer;

removing a portion of the wafer than lies above the implant plane;

heating the resulting structure to cause the silicon containing layer to bond to the glass layer; and polishing the resulting silicon containing layer side of the resulting structure.

* * * * *